US008767351B1

(12) United States Patent
Li et al.

(10) Patent No.: US 8,767,351 B1
(45) Date of Patent: Jul. 1, 2014

(54) AMBIENT TEMPERATURE BALL BOND

(71) Applicant: Seagate Technology LLC, Cupertino, CA (US)

(72) Inventors: Leping Li, Bloomington, MN (US); Saravuth Keo, Prior Lake, MN (US); Kara L. Maytag, Plymouth, MN (US); Pramit P. Parikh, Eden Prairie, MN (US); Jeff R. O'Konski, Savage, MN (US); Mark A. Herendeen, Shakopee, MN (US); Joel W. Hoehn, Hudson, WI (US); Roger L. Hipwell, Eden Prairie, MN (US); Joe J. Schobel, Lakeville, MN (US); John L. Ibele, Minneapolis, MN (US); Ralph Marquart, Hudson, WI (US); Edward Knutson, Burnsville, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/755,175

(22) Filed: Jan. 31, 2013

(51) Int. Cl.
G11B 5/48 (2006.01)

(52) U.S. Cl.
USPC ...................................... 360/234.3

(58) Field of Classification Search
CPC .......... G11B 5/48; G11B 5/486; G11B 5/746; G11B 5/455; G11B 5/147; G11B 17/04; G11B 5/60; B24B 37/00; B24B 37/34; H05K 13/00
USPC .......... 360/234.3, 234.4, 234.5, 234.6, 234.7; 29/603.09, 603.12, 603.16
See application file for complete search history.

(56) References Cited

U.S. PATENT DOCUMENTS

| | | | | |
|---|---|---|---|---|
| 5,717,547 A * | 2/1998 | Young | .......................... | 360/246 |
| 5,737,152 A * | 4/1998 | Balakrishnan | ............. | 360/245.9 |
| 5,754,369 A * | 5/1998 | Balakrishnan | ............. | 360/264.2 |
| 5,812,344 A * | 9/1998 | Balakrishnan | ............. | 360/245.9 |
| 5,867,888 A * | 2/1999 | Voldman et al. | ........... | 29/603.12 |
| 5,984,162 A * | 11/1999 | Hortaleza et al. | .......... | 228/110.1 |
| 5,995,328 A * | 11/1999 | Balakrishnan | ............. | 360/245.9 |
| 6,698,646 B2 | 3/2004 | Chan et al. | | |
| 7,236,334 B2 * | 6/2007 | Ding et al. | .................... | 360/323 |
| 7,345,853 B2 * | 3/2008 | Ding et al. | .................... | 360/323 |
| 8,259,415 B2 * | 9/2012 | Hutchinson et al. | ....... | 360/234.5 |
| 8,633,584 B2 * | 1/2014 | Salmon | ......................... | 257/700 |
| 2002/0063361 A1* | 5/2002 | Fahey | .......................... | 264/400 |
| 2003/0049886 A1* | 3/2003 | Salmon | ......................... | 438/106 |
| 2005/0133566 A1* | 6/2005 | Variyam | .................... | 228/110.1 |
| 2005/0140026 A1* | 6/2005 | Salmon | ......................... | 257/778 |
| 2005/0195247 A1* | 9/2005 | Yanagisawa et al. | .......... | 347/68 |

(Continued)

OTHER PUBLICATIONS

Pan et al., "Wire Bonding Challenges in Optoelectronics Packaging", Society of Manufacturing Engineers, Dearborn, MI, TP04PUB284, 2004, 10 pages.

(Continued)

*Primary Examiner* — Allen T Cao
(74) *Attorney, Agent, or Firm* — HolzerIPLaw, PC

(57) ABSTRACT

The presently disclosed technology describes systems and methods for attaining a ball bond using less than 1 thousandth of an inch diameter gold wire using ultrasonic bonding energy and without heating an underlying bonding pad. The ball bond allows the use of particularly small bonding pads that are particularly close to adjacent microelectronic structures that limit the use of other bonding techniques that have shallow take-off angles.

20 Claims, 7 Drawing Sheets

(56) References Cited

U.S. PATENT DOCUMENTS

| | | | |
|---|---|---|---|
| 2006/0044702 A1* | 3/2006 | Ding et al. | 360/323 |
| 2007/0178623 A1* | 8/2007 | Shimokawa et al. | 438/106 |
| 2007/0257335 A1* | 11/2007 | O'Brien | 257/618 |
| 2008/0066294 A1* | 3/2008 | Mahadev et al. | 29/603.06 |
| 2009/0315947 A1* | 12/2009 | Atsuta | 347/50 |
| 2010/0167468 A1* | 7/2010 | Shimokawa et al. | 438/120 |
| 2010/0297814 A1* | 11/2010 | Salmon | 438/128 |
| 2010/0321829 A1* | 12/2010 | Hutchinson et al. | 360/234.5 |
| 2011/0272449 A1* | 11/2011 | Pirkle et al. | 228/1.1 |
| 2014/0027919 A1* | 1/2014 | Nakayama et al. | 257/773 |

OTHER PUBLICATIONS

Xu et al., "Effect of bonding duration and substrate temperature in copper ball bonding on aluminium pads: A TEM study of interfacial evolution", Microelectronics Reliability 51 (2011) 113-118.

* cited by examiner

AMBIENT TEMPERATURE BALL BOND

BACKGROUND

Wire bonding is a method of making electrical interconnections among bonding pads, such as those located on an integrated circuit (IC) device and/or a printed circuit board (PCB) during semiconductor and/or storage device fabrication. Further, wire bonding can be used to connect an IC to other electronics or to connect from one PCB to another. Wire bonding is generally considered a cost-effective and flexible interconnect technology, which is used to assemble a wide variety of semiconductor packages. There are two main classes of wire bonding, wedge bonding and ball bonding. Both wedge bonding and ball bonding are typically accomplished using a combination of heat, compressive force, and ultrasonic energy to bond a wire to one or more bonding pads.

Wedge bonding is typically carried out at room temperature, but has several limitations. First, the take-off angle and direction are substantially limited. Second, the wedge bond creates a relatively large foot size. Third, additional wedge bonds may not be stacked on top of a previous bonded spot on a bonding pad. As a result, wedge bonding is not an available options in applications with very small bonding pads or when an extruded object is in front of the take-off direction of the wedge bonded wire. Further, the bonded spot may not be reused due to oxidation (e.g., when an aluminum alloy wire is used), which could become a problem when the size of the bonding pad size is small and rewiring is necessary.

As distinct from wedge bonding, ball bonding typically heats the bonding pad to create the bond. However, heating the bonding pad may not be an available option due to the heat potentially damaging sensitive IC devices adjacent the bonding pad or other components of the IC (e.g., adhesives). Ball bonding has several advantages over the wedge bond, such as more flexibility in take-off direction and angle from the bonding pad without inducing unacceptable stresses on the bond, greatly reduced bonding size, and ball-on-ball stacking capability.

SUMMARY

A method comprising ball bonding a less than about 1 thousandth of an inch in diameter gold alloy wire to a gold alloy contact pad at about ambient temperature and using a ultrasonic bonding frequency greater than 60 kHz and less than 200 kHz.

Other implementations are also described and recited herein.

BRIEF DESCRIPTIONS OF THE DRAWINGS

DETAILED DESCRIPTION

Figure 1:
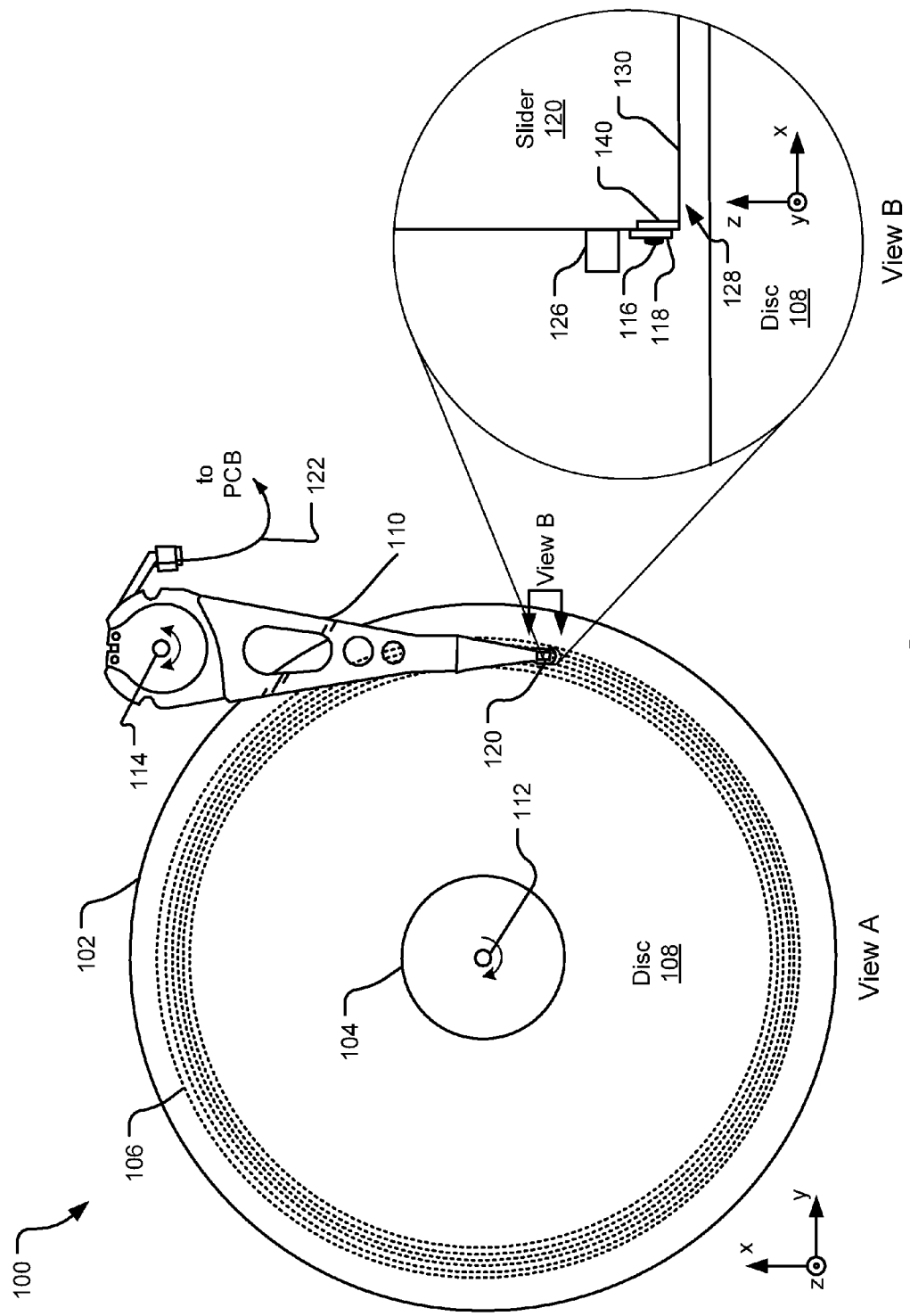
FIG. 1 illustrates an example disc drive assembly including a ball bond remnant on a bonding pad of a slider located at a distal end of an actuator arm and positioned over a storage media disc.

FIG. 1 illustrates an example disc drive assembly 100 including a ball bond remnant 116 on a bonding pad 118 of a slider 120 (e.g., an AlTiC slider) located at a distal end of an actuator arm 110 and positioned over a storage media disc 108. Referring specifically to View A (x-y plane), the disc 108 includes an outer diameter 102 and an inner diameter 104, between which are a number of substantially circular data tracks (e.g., track 106) illustrated by circular dotted lines. In some implementations, there are more data tracks than illustrated in FIG. 1. The disc 108 rotates at a high speed about a disc axis of rotation 112 as information is written to and read from the data tracks on the disc 108. The disc rotation speed may be fixed or variable.

Information may be read from or written to the disc 108 through the use of read/write elements on the slider 120, which is located at a distal end of an actuator arm 110. The actuator arm 110 rotates about an actuator axis of rotation 114 during a seek operation to locate a desired data track and sector on the disc 108. Specific locations on the media disc 108 may be defined by any available addressing scheme (e.g., cylinder-head-sector (CHS) addressing and logical block addressing (LBA) schemes). The actuator arm 110 extends toward the disc 108 and the slider 120 is located at the distal end of the actuator arm 110. The slider 120 flies in close proximity above the disc 108 while reading and writing data to the disc 108. In other implementations, there is more than one slider 120, actuator arm 110, and/or disc 108 in the disc drive assembly 100.

A flex cable 122 provides the requisite electrical connection paths from a printed circuit board (PCB, not shown) to electronic components attached to the slider 120 (e.g., a read element and a write element), while allowing pivotal movement of the actuator arm 110 during operation. The flex cable 122 may be routed along the actuator arm 110 from the PCB to the slider 120. The PCB may include circuitry (e.g., a preamplifier (preamp)) for controlling the write currents applied to the write element during a write operation and amplifying read signals generated by the read element during a read operation).

A side view of a trailing edge of the slider 120 is shown in detail in View B of the x-z plane of FIG. 1. The slider 120 includes the bonding pad 118 (e.g., an electronic lapping guide (ELG) bonding pad with the ball bond remnant 116 attached thereto. The ball bond remnant 116 is a remnant from a wire previously ball bonded to the bonding pad 118. In some implementations, the ball bond remnant 116 is removed (e.g., by mechanically shaving it off of the bonding pad 118). Further, the slider 120 may include additional bonding pads and ball bond remnants (not shown) behind the bonding pad 118 and the ball bond remnant 116 in the negative y-direction.

The slider 120 may further include a microelectronic component 126 protruding from the slider 120 (e.g., a laser in a heat assisted magnetic recording (HAMR) device). In one implementation, the wire previously ball bonded to the bonding pad 118 is intentionally routed around the microelectronic component 126 to avoid contact with the protruding microelectronic component 126 as shown in detail in FIGS. 2 and 4. Further, the slider 120 may include additional microelectronic components (not shown) behind the microelectronic component 126 in the negative y-direction.

The slider 120 further includes a planarization sensor 140 (also referred to as an "electronic lapping guide" or "ELG") embedded within. The planarization sensor 140 electrically connects at least two bonding pads together within the slider 120. A cross-sectional area in the y-z plane of the planarization sensor 140 defines a resistive value of the planarization sensor 140 between the least two bonding pads. Prior to forming the air bearing surface (ABS) 130, the slider 120 is planarized (e.g., using lapping and/or chemical-mechanical polishing (CMP)), the y-z cross-sectional area of the planarization sensor 140 shrinks and its resistive value increases. The resistive value of the planarization sensor 140 can be measured and used to determine the amount of material removal on the ABS 130. As a result, planarization of the ABS 130 can be precisely controlled using the measured resistive value of the planarization sensor 140 and built-in actuators in a lapping carrier (not shown).

An air-bearing 128 caused by aerodynamic forces is created between the ABS 130 of the slider 120 and a top surface of the disc 108 when the disc 108 is in motion. The ABS 130 of the slider 120 faces the disc 108 surface and is approximately parallel to the disc 108 surface (i.e., both are approximately in the x-y plane. As a result, no portion of the slider 120 substantially protrudes beyond the ABS 130 toward the disc 108 surface. An example process for creating this substantially smooth surface is described in detail with respect to FIGS. 2-5 below.

The appearances of the slider 120 and other features of assembly 100 are for illustration purposes only and not drawn to scale. Further, the presently disclosed ball bonding technology may apply to storage drive assemblies other than the disc drive assembly 100 depicted in FIG. 1. Still further, the presently disclosed technology may be used to ball bond wires to microelectronic devices other than sliders used in devices other than electronic storage devices.

Figure 2:
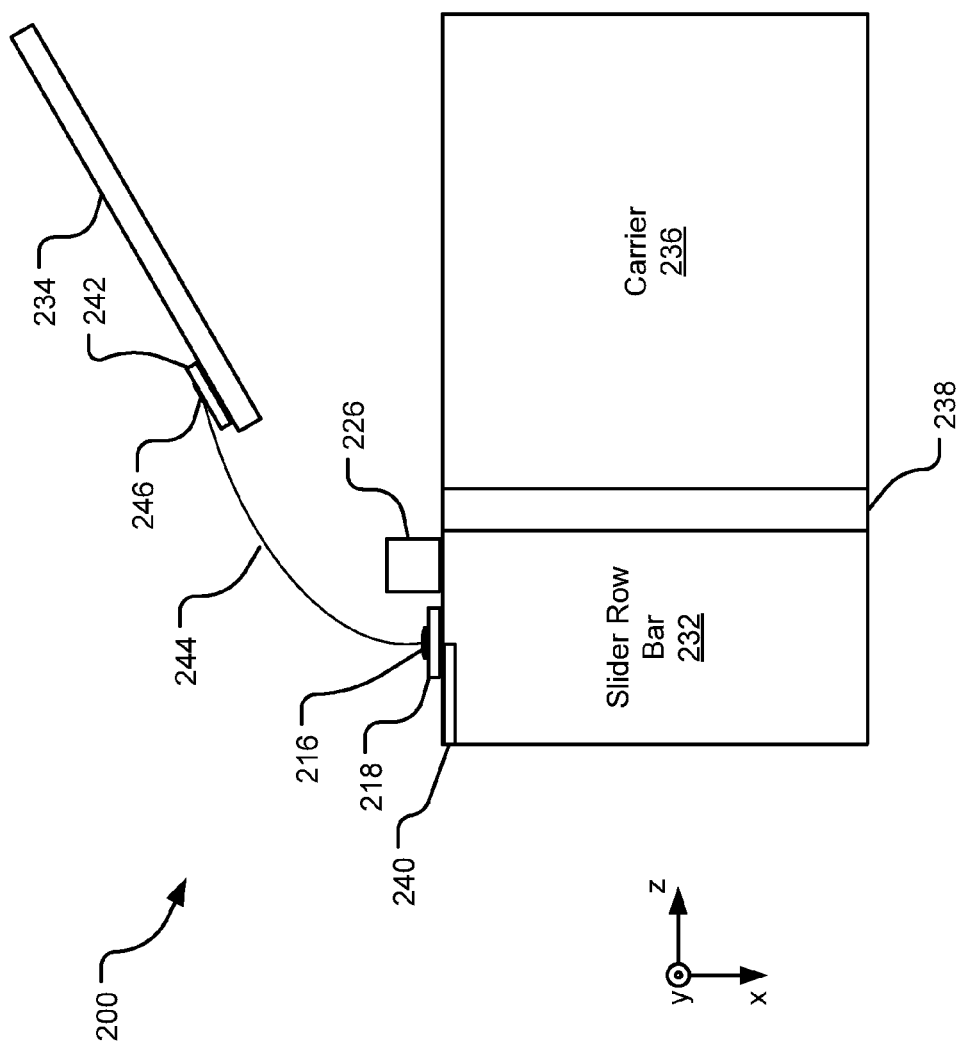
FIG. 2 illustrates a side view of an example lapping carrier assembly that includes a slider row bar ball bonded to a printed circuit board.

FIG. 2 illustrates a side view of an example lapping carrier assembly 200 that includes a slider row bar 232 ball bonded to a printed circuit board 234. The assembly 200 is used to obtain an accurately planarized and highly smooth (e.g., subnanometer variations) surface which will be patterned to form an air-bearing surface (ABS) (not shown, see FIGS. 1, 4, and 5). The row bar 232 includes a row of sliders (e.g., slider 124 of FIG. 1) for inclusion in a storage drive assembly (e.g., disc drive assembly 100 of FIG. 1), for example. In other implementations, the row bar 232 includes a row of microelectronic devices other than sliders.

The row bar 232 is releasably bonded to a lapping carrier 236 using an adhesive 238 (e.g., a wafer grip or adhesive). The row bar 232 includes a microelectronic component 226 protruding from the row bar 232. In one implementation, the microelectronic component 226 is a laser in a heat assisted magnetic recording (HAMR) device. The row bar 232 further includes the bonding pad 218, which provides an electrical connection to a planarization sensor 240 embedded within the row bar 232. The planarization sensor 240 is discussed in more detail with reference to FIGS. 3 and 4. In various implementations, the bonding pad 218 may be made of or coated with gold or metallic alloys. In one implementation, the bonding pad 218 is quite small (e.g., 127 μm×85 μm or 50 μm×50 μm square) and has a less than 1 micron thick (e.g., 0.25 microns thick) gold coating layer.

The PCB 234 includes a PCB bonding pad 242, which provides an electrical connection to the PCB 234, which in turn may connect to a lapping control unit that monitors and adjusts lapping operations on the row bar 232 in real time. The PCB 234 is connected to the row bar 232 via an electric trace 244 (or wire) connecting the bonding pads 218, 242. In various implementations, the trace 244 may be made of a gold or copper alloy. The PCB 234 may be mounted in any location and orientation with respect to the row bar 232 that is convenient. In one example implementation, a planar bonding surface of the PCB bonding pad 242 is mounted at an angle (e.g., approximately 5 degrees) with respect to a planar bonding surface of the bonding pad 218 (e.g., the y-z plane) and is mounted to a top surface of the assembly 200 (not shown) via a strip of double-stick tape or a mechanical lock, for example.

In this implementation, one end of the trace 244 is ball bonded to the bonding pad 218 (as depicted by ball bond 216). The ball bond is used in lieu of a wedge bond for several reasons. One, the takeoff angle of the wedge bond is limited to a relatively shallow angle from the bonding pad surface (e.g., less than 45 degrees) and a direction generally in the x-z plane (based on the orientation of a foot of the wedge bond). Due to the proximity of the bonding pad 218 to the microelectronic component 226 protruding from the row bar 232 and the relative height in the negative x-direction of the microelectronic component 226 protruding from the row bar 232, such a shallow takeoff angle in a general direction of the PCB 234 may not be possible without colliding with the microelectronic component 226. Further, the foot of the wedge bond may be too large to accommodate the small size of the bonding pad 218 and/or the wedge bond may render the bonding pad 218 unusable for later electrical connections without additional processing of the bonding pad 218 surface.

However, ball bonding typically requires heat to be applied to the bonding pad 218 to create a sufficiently strong bond to the trace 244. In many implementations, the temperature of the bonding pad 218 would exceed 125 degrees Celsius to form a sufficiently strong bond. This relatively high temperature may cause the adhesive 238 to melt or become soft, which could cause the row bar 232 to become loose or detached from the carrier 236, especially if and when any shear force is applied to the row bar 232 generally in the x-direction. In addition, thermal cycling the lapping carrier assembly 200 may alter the adhesive's mechanical properties and induce additional stress and strain to the assembly 200, which can deform the assembly 200 and negatively impact lapping performance.

In order to ball bond without thermally cycling the assembly 200, a ball bonding tool (not shown) may apply ultrasonic energy (e.g., 120 kHz) and compressive force (e.g., 0.2N using a 0.8 mil diameter gold wire) to bond the trace 244 to the bonding pad 218 without heating the bonding pad 218. Utilizing a high ultrasonic frequency (e.g., 120 kHz over 60 kHz) and properly scrubbing the bonding pad 218 to clean the bonding pad 218 enhances the energy transfer efficiency and interatomic movement during the bonding of the trace 244 to the pad 218. As a result, the trace 244 may be bonded to the pad 218 without applying any heat directly to the bonding pad 218. In other words, the trace 244 may be bonded to a relatively cool bonding pad 218 (e.g., at ambient or room temperature). More specifically, ambient temperature is referred to herein as ranging from about 15-25 degrees Celsius). In other implementations, the ball bonding process described herein may be performed successfully with the bonding pad 218 between 18-30 degrees Celsius or between 15-50 degrees Celsius. In an example implementation, the ultrasonic frequency applied to form trace 244 is approximately 120 kHz and the trace 244 is primarily gold with an approximately 0.7 mil diameter. In other implementations, the ultrasonic frequency applied to the trace 244 ranges from above 60 kHz to below 200 kHz.

An opposite end of the trace 244 is stitch bonded to the bonding pad 242. In other implementations, the trace 244 is ball bonded to the bonding pad 242 and stitch bonded to the bonding pad 218.

In one implementation, the trace 244 diameter is less than about 1 thousandth of an inch in diameter of a gold alloy wire. The trace 244 may be less than about 1 thousandth of an inch in diameter in order to yield a ball bond with a size (e.g., cross-sectional area) significantly smaller than the contact pad 218 surface area. For example, a 0.7 thousandths of an inch trace may yield a ball bond approximately 33 µm in diameter on a 60 µm×60 µm contact pad. As the trace 244 diameter becomes smaller, ball bonding the trace 244 to a contact pad without applying thermal energy rapidly becomes more difficult.

First, the transfer of ultrasonic energy in ball bonding become less efficient with decreasing trace 244 diameter due to an increasing disparity between a fixed ultrasonic energy of the bonding tool (e.g., 120 kHz) and the rapidly increasing resonant frequency associated with the ball at the end of the trace 244. The increasing resonant frequency is proportional to $1/\sqrt{m}$, where m represents the mass of the ball at the end of the trace 244. As the mass approaches zero, the resonant frequency approaches infinity. Second, as the trace 244 diameter decreases, the trace 244 is more susceptible to breaking, which renders the trace 244 increasingly difficult to handle and susceptible to breakage. Even with 0.5 mil diameter gold wire, the trace 244 becomes extremely fragile and is therefore extremely difficult to perform consistent ball bonding using such a small diameter wire. As a result, ball bonding a trace 244 less than about 1 mil (e.g., 0.7 mil) in diameter is far less efficient in energy transfer and therefore much more challenging than ball bonding a trace between 1 mil and 2 mil, or greater, in diameter.

Further, as discussed above, the ultrasonic energy used to ball bond the trace 244 should match the resonant frequency of the trace 244 ball within an acceptable tolerance to maximize the energy transfer to the ball and pad 218. Applying the ultrasonic energy to the trace 244 becomes more difficult as the resonant frequency increases. In one example implementation, the trace 244 resonant frequency is constrained such that a 200 kHz ultrasonic bonding frequency effectively works to create a ball bond without directly adding thermal energy at the bonding pad 218. In other implementations, a 120 kHz ultrasonic bonding frequency effectively works to ball bond a 0.7 mil diameter trace without heating the trace. Other ultrasonic bonding frequencies are contemplated herein.

Figure 3:
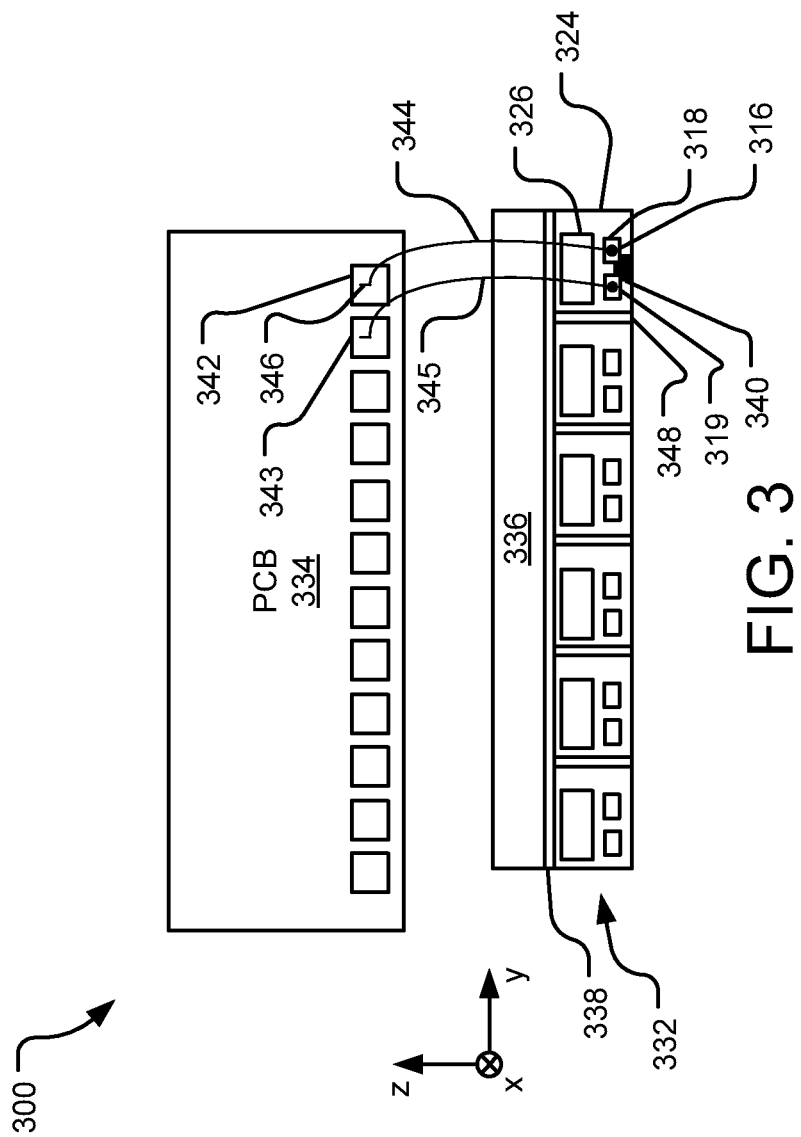
FIG. 3 illustrates a top view of an example lapping carrier assembly that includes a slider row bar with one pair of bonding pads ball bonded to a corresponding pair of bonding pads on a printed circuit board.

FIG. 3 illustrates a top view of an example lapping carrier assembly 300 that includes a slider 324 in a row bar 332 with a pair of bonding pads 318, 319 ball bonded to a corresponding pair of bonding pads 342, 343 on a printed circuit board 334. The row bar 332 includes a row of sliders (e.g., the slider 324), each of which may be included in a storage drive assembly (e.g., disc drive assembly 100 of FIG. 1) or other electronic device. In other implementations, the row bar 332 includes a row of microelectronic devices other than sliders.

After ABS patterning, the individual sliders may be separated by dicing the row bar 332 using dicing lanes (e.g., dicing lane 348). The depicted row bar 332 includes six separate sliders, although other implementations may include greater or fewer numbers of separate sliders. In one example implementation, the row bar includes 62 separate functional sliders and two non-functional (or "dummy") sliders at each end of the row bar. While slider 324 is discussed with specificity with reference to FIG. 3, any one or more of the other depicted sliders may be used in a similar manner.

The row bar 332 is releasably bonded to a carrier 336 using an adhesive 338. The slider 324 includes a microelectronic component 326 protruding from the row bar 332 (in the negative x-direction). In one implementation, the microelectronic component 326 is a laser for use in a heat assisted magnetic recording (HAMR) device. The slider 324 further includes bonding pads (e.g., bonding pads 318, 319), each of which may provide an electrical connection to a planarization sensor (not shown) embedded within the slider 324. Here, the slider 324 is depicted with two bonding pads for real-time in-situ monitoring and control of a lapping process, although other implementations may have greater or fewer numbers of bonding pads with varied functionality.

The PCB 334 includes PCB bonding pads (e.g., PCB bonding pads 342, 343), each of which provides an electrical connection to the PCB 334 (e.g., to a lapping control unit (not shown) on or electrically connected to the PCB 334). Here, the PCB 334 is depicted with 12 PCB bonding pads, although other implementations may have greater or fewer numbers of PCB bonding pads. The PCB 334 is connected to the slider 324 via electric traces or wires. For example, bonding pad 318 is connected to PCB bonding pad 342 via electric trace 344 and bonding pad 319 is connected to PCB bonding pad 343 via electric trace 345. Here, two electric traces are depicted, although other implementations may have greater or fewer numbers of electric traces. The PCB 334 may be mounted in any location and orientation with respect to the row bar 332 that is convenient.

The slider 324 further includes a planarization sensor 340 embedded within (illustrated by dotted lines). The planarization sensor 340 electrically connects to the bonding pads 318, 319 on the slider 324. A cross-sectional area of the planarization sensor 340 is proportionally related to a resistive value of the planarization sensor 340. As the slider 324 is planarized (e.g., using lapping and/or chemical-mechanical polishing (CMP)), the cross-sectional area of the planarization sensor 340 decreases as its resistive value increases. A resistance value of the planarization sensor 340 correlates to the amount of material removal at the lapping surface of the slider 324. As a result, the slider 324 surface can be precisely planarized using the measured resistive value of the planarization sensor 340.

In this implementation, the traces 344, 345 are ball bonded (see e.g., ball bond 316) to the bonding pads 318, 319, respectively. The ball bond is used in lieu of a wedge bond for several reasons. One, the takeoff angle of the wedge bond is limited to a relatively shallow angle from the bonding pad surface (e.g., less than 45 degrees) and a direction generally in the x-z plane (based on the orientation of a foot of the wedge bond). Due to the close proximity of the bonding pads 318, 319 to the microelectronic component 326 protruding from the row bar 332 and the relative height in the negative x-direction of the microelectronic component 326 protruding from the row bar 332, such a shallow takeoff angle in a general direction of the PCB 334 may not be possible without colliding with the microelectronic component 326. Further, the foot of the wedge bond may be too large to accommodate the small size of the bonding pad 318 and/or the wedge bond may render the bonding pad 318 unusable for later electrical connections without additional processing of the bonding pad 318 surface.

However, ball bonding typically requires heat to be applied to the bonding pad 318 to create a sufficiently strong bond to the trace 344. In many implementations, the temperature of the slider 324 would exceed 125 degrees Celsius to create a sufficiently strong bond. This high temperature may cause the adhesive 338 to melt or become soft, which may cause the row bar 332 to become loose or detached from the carrier 336, especially if and when any shear force is applied to the bonding pad 318 or other component of the row bar 332 generally in the x-direction. In addition, the thermally cycling the assembly 300 may alter the adhesive's mechanical properties and induce additional stress and strain to the assembly 300, which can deform the assembly 300 and negatively impact lapping performance and/or the output specifications for the row bar 332.

In order to ball bond without thermally cycling the assembly 300, a ball bonding tool (not shown) may apply a relatively high frequency ultrasonic energy and compressive force with proper scrubbing of the bonding pad surfaces to bond the traces 344, 345 to the bonding pads 318, 319, respectively. The relatively high frequency ultrasonic signal reduces the energy gap between the ultrasonic frequency and the ball bond's resonant frequency, thereby enhancing the efficiency of ultrasonic energy transfer during bonding of the traces 344, 345 to the pads 318, 319. As a result, the traces 344, 345 may be bonded to the pads 318, 319 without applying any thermal energy directly to the bonding pads 318, 319 and while the bonding pads 318, 319 are generally maintained at room temperature with no thermal energy directly applied to the bonding pads 318, 319.

An opposite end of each of the traces 344, 345 is stitch bonded to the PCB 334 at bonding pads 342, 343. In other implementations, the traces 344, 345 are ball bonded to the bonding pads 342, 343 and stitch bonded to the bonding pads 318, 319.

Figure 4:
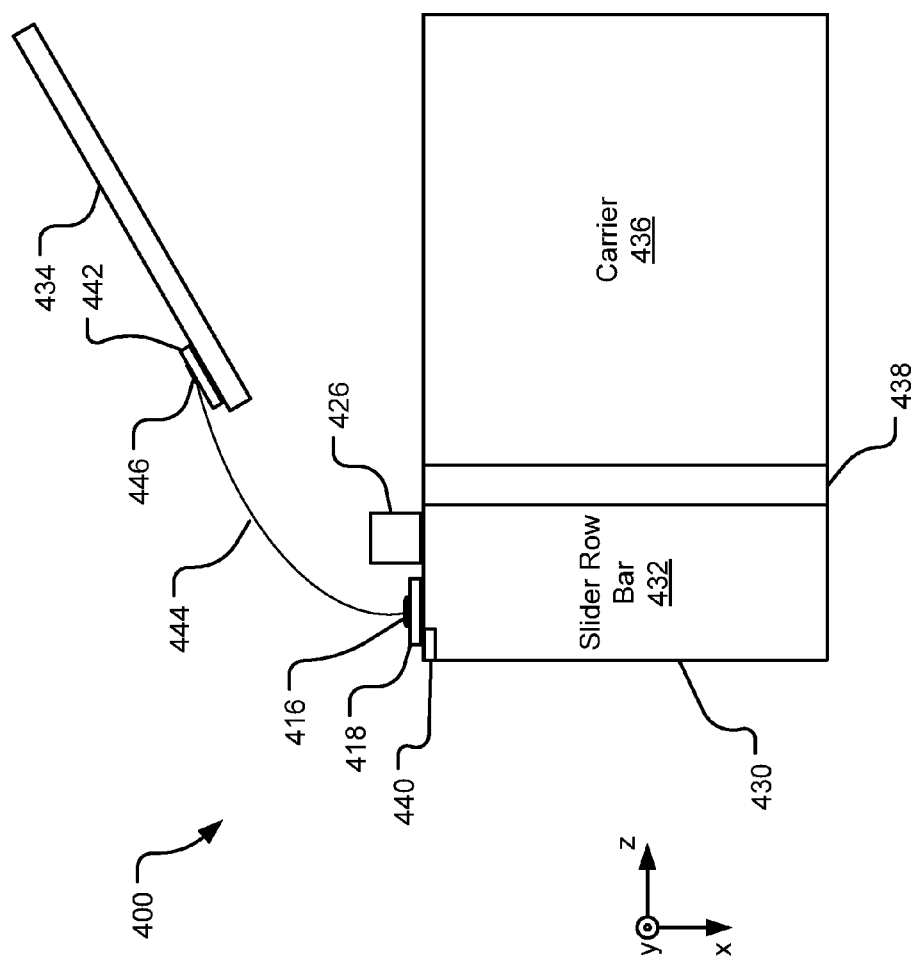
FIG. 4 illustrates a side view of an example lapping carrier assembly that includes a slider row bar ball bonded to a printed circuit board with an air-bearing surface of the slider row bar lapped co-planar with a planarization sensor embedded within the slider row bar.

FIG. 4 illustrates a side view of an example lapping carrier assembly 400 that includes a slider row bar 432 ball bonded to a printed circuit board 434 with an air-bearing surface 430 of the slider row bar 432 lapped co-planar with a planarization sensor 440 embedded within the slider row bar 432. The planarization assembly 400 is used to precisely lap the slider row bar 432 to obtain an accurately planarized and highly smooth air-bearing surface 430 of the row bar 432. The row bar 432 includes a row of sliders (e.g., slider 124 of FIG. 1) for inclusion in a storage drive assembly (e.g., disc drive assembly 100 of FIG. 1), for example. In other implementations, the row bar 432 includes a row of microelectronic devices other than sliders.

The row bar 432 is releasably bonded to a carrier 436 using an adhesive 438. The row bar 432 includes microelectronic components (e.g., microelectronic component 426) protruding from the row bar 432. In one implementation, the microelectronic component 426 is a laser in a heat assisted magnetic recording (HAMR) device. The row bar 432 further includes bonding pads (e.g., bonding pad 418), which provide electrical connections to the row bar 432 (e.g., specifically to the planarization sensor 440).

The row bar 432 further includes planarization sensors (e.g., planarization sensor 440 embedded within (illustrated by dotted lines). Each of the planarization sensors is electrically connected to a pair of bonding pads. For example, planarization sensor 440 is electrically connected to bonding pad 418 and a second bonding pad adjacent the bonding pad 418 (not shown) in the y-direction. A cross-sectional area (e.g., in the x-z plane) of the planarization sensor 440 defines a resistive value of the planarization sensor 440. As an air-bearing surface 430 (ABS) is planarized (e.g., using mechanical and/or chemical-mechanical polishing (CMP)), the x-z planar area of the planarization sensor 440 decreases and its resistive value increases (see planarization sensor 240 of FIG. 2 as compared to planarization sensor 440 of FIG. 4. The resistive value of the planarization sensor 440 is a measurable quantity indicating the amount of planarization at the air-bearing surface 430. As a result, the air-bearing surface 430 can be precisely planarized using the measured resistive value of the planarization sensor 440 and built-in actuators in the lapping carrier 436.

The PCB 434 includes PCB bonding pads (e.g., PCB bonding pad 442), which provide an electrical connections to the PCB 434 (e.g., to a lapping control unit (not shown). The PCB 434 is connected to the row bar 432 via electric traces or wires (e.g., electric trace 444) connecting the bonding pads. For example, electric trace 444 connects bonding pads 418, 442. The PCB 434 may be mounted in any location and orientation with respect to the row bar 432 that is convenient. In this implementation, the trace 444 is ball bonded to the bonding pad 418 (as depicted by ball bond 416) and stitch bonded (as depicted by stitch bond 446) to the bonding pad 442. In other implementations, the trace 444 is ball bonded to the bonding pad 442 and stitch bonded to the bonding pad 418.

Figure 5:
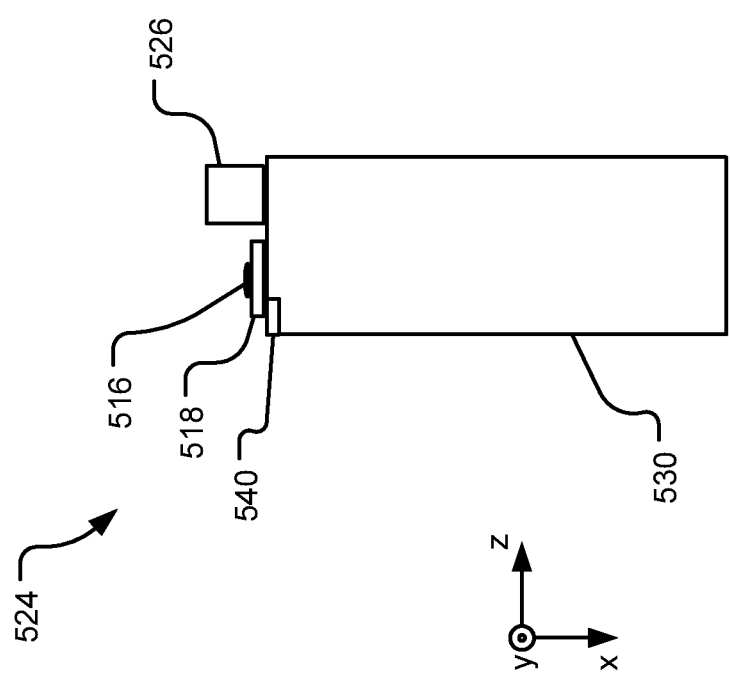
FIG. 5 illustrates a side view of an example slider row bar with a ball bond remnant attached thereto.

FIG. 5 illustrates a side view of an example slider 524 with a ball bond remnant 516 attached thereto. The slider 524 includes a microelectronic component 526 protruding from the slider 524 in the negative x-direction. In one implementation, the microelectronic component 526 is a laser for a laser-in-slider (LIS) heat assisted magnetic recording (HAMR) technique. The slider 524 further includes a bonding pad 518, which provides an electrical connection to the slider 524, and a planarization sensor 540 embedded within the slider 524.

After an air-bearing surface 530 of a slider row bar (not shown, see row bar 232, 332, 432 of FIGS. 2, 3, and 4, respectively) is adequately lapped, a printed circuit board (not shown, see PCB 234, 334, 444 of FIGS. 2, 3, and 4, respectively) and corresponding trace(s) (not shown, see trace 244, 344, 444 of FIGS. 2, 3, and 4, respectively) from the slider row bar to the PCB are removed. Further, the slider row bar is diced, after ABS patterning operations, into individual sliders (e.g., slider 524) and used as sliders in a storage drive assembly (e.g., disc drive assembly 100 of FIG. 1), for example.

Figure 6:
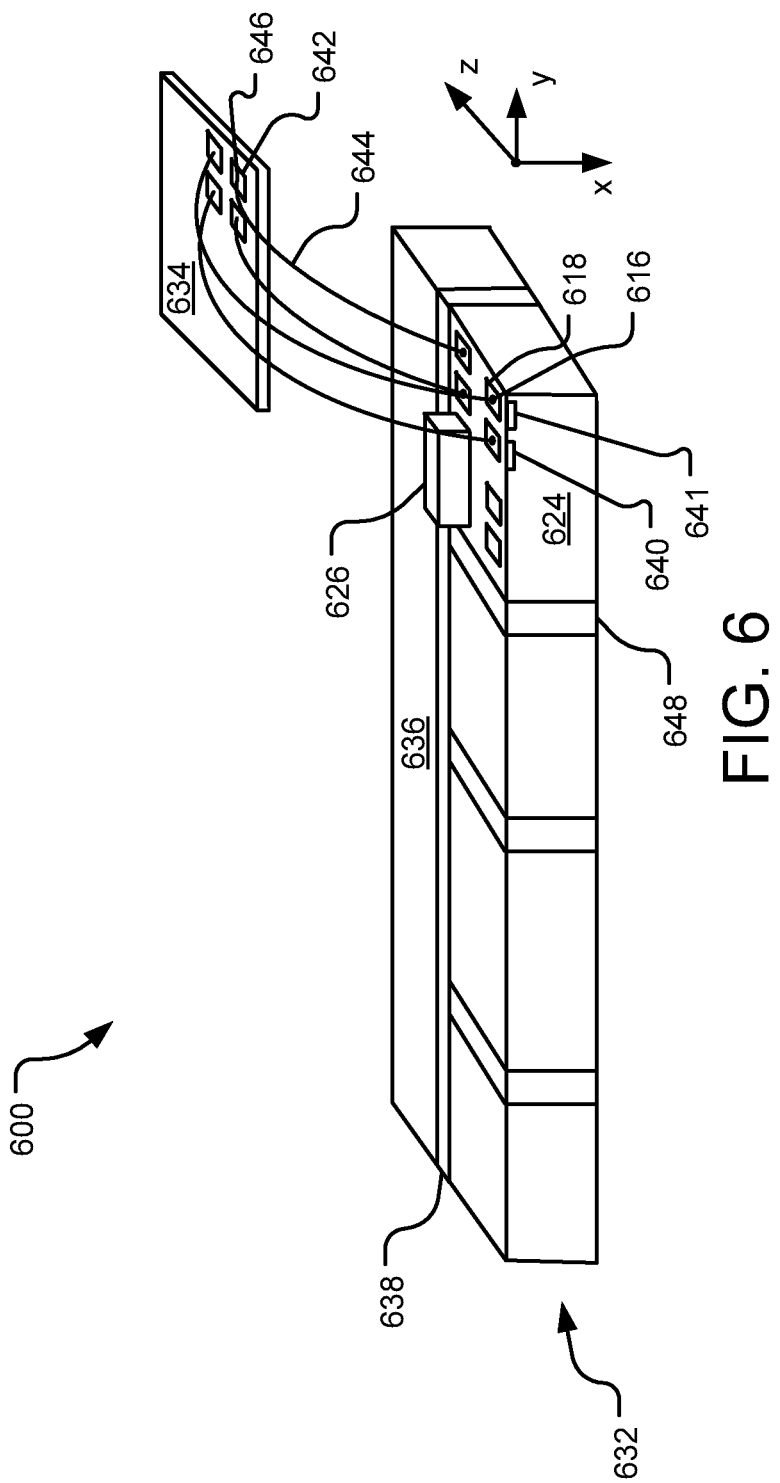
FIG. 6 illustrates a perspective view of an example lapping carrier assembly that includes an example slider in a row bar ball bonded to a printed circuit board.

FIG. 6 illustrates a perspective view of an example lapping carrier assembly 600 that includes an example slider row bar 632 ball bonded to a printed circuit board 634. The row bar 632 includes a row of sliders (e.g., slider 624), each of which may be included in a storage drive assembly (e.g., disc drive assembly 100 of FIG. 1) or other electronic device. In other implementations, the row bar 632 includes a row of microelectronic devices other than sliders. After the ABS is fully patterned, the individual sliders may be separated by cutting up the row bar 632 using dicing lanes (e.g., dicing lane 648). Here, the row bar 632 may be separated into four separate sliders using the dicing lanes, although other implementations may have greater or fewer numbers of separate sliders. While slider 624 is discussed with specificity with reference to FIG. 6, any one or more of the other depicted sliders may be used in a similar manner.

The row bar 632 is releasably bonded to a carrier 636 using an adhesive 638. The slider 624 includes a microelectronic component 626 protruding from the row bar 632 (in the negative x-direction). In one implementation, the microelectronic component 626 is a laser for a laser-in-slider (LIS) heat assisted magnetic recording (HAMR) device. The slider 624 further includes bonding pads (e.g., bonding pad 618). Here, the slider 624 is depicted with six bonding pads, four of which provide an electrical connections to planarization sensors 640, 641 within the slider 624. Other implementations may have greater or fewer bonding pads, any number of which with electrical connections to the slider 624. The planarization sensors 640, 641 (e.g., a reader planarization sensor 640 and a writer planarization sensor 641) embedded within the slider 624. Each of the planarization sensors 640, 641 are electrically connected to at least two of the bonding pads and may be used to monitor planarization operations on the row bar 632 (as described in detailed above).

The PCB 634 includes PCB bonding pads (e.g., PCB bonding pad 642), each of which provides an electrical connection to the PCB 634 (e.g., to a lapping control unit (not shown)). Here, the PCB 634 is depicted with four PCB bonding pads, although other implementations may utilize a greater or fewer number of PCB bonding pads. The PCB 634 is connected to the slider 624 via electric traces or wires (e.g., electrical trace 644) connecting the bonding pads 618, 642. Here, four electrical traces are depicted, although other implementations may utilize a greater or fewer number of traces. The PCB 634 may be mounted in any location and orientation with respect to the row bar 632 that is convenient.

In this implementation, the traces are ball bonded to the bonding pads on the slider 624 (as depicted by ball bond 616). The ball bond is used in lieu of a wedge bond for several reasons. One, the takeoff angle of the wedge bond is limited to a relatively shallow angle from the bonding pad surface (e.g., less than 45 degrees) and a direction generally in the x-z plane (based on the orientation of a foot of the wedge bond). Further, the foot of the wedge bond may be too large to accommodate the small size of the slider 624 bonding pads and/or the wedge bond may render the slider 624 bonding pads unusable for later electrical connections without additional processing of the bonding pad surfaces.

Ball bonding typically requires heat to be applied to the bonding pads to create a sufficiently strong bond to the traces. In many implementations, the temperature of the slider 624 would exceed 125 degrees Celsius to create a sufficiently strong bond. The high of a temperature may cause the adhesive 638 to melt or become soft, which would risk the row bar 632 becoming loose or detached from the carrier 636, especially if and when any shear force is applied to the bonding pad 618 or other component of the row bar 632 generally in the x-direction. In addition, the thermally cycling the assembly 600 may alter the adhesive's mechanical properties and induce additional stress and strain to the assembly 600, which can deform the assembly 600 and negatively impact lapping performance.

In order to ball bond without thermally cycling the assembly 600, a ball bonding tool (not shown) may apply a relatively high frequency ultrasonic energy and compressive force with proper scrubbing on the bonding pad surfaces to clean the bonding pad surfaces to bond the traces to the bonding pads on the slider 624. The relatively high frequency ultrasonic signal enhances the efficiency of ultrasonic energy transfer during bonding of the traces to the bonding pads on the slider 624. As a result, the traces may be bonded to the bonding pads on the slider 624 without directly heating (e.g., applying thermal energy) to the bonding pads and while the bonding pads are generally at room temperature.

An opposite end of each of the four depicted traces is stitch bonded to the bonding pads on the PCB 634 (as depicted by stitch bond 646). In other implementations, the traces are ball bonded to the bonding pads 642 on the PCB 634 and stitch bonded to the bonding pads on the slider 624.

Due to the close proximity of the four depicted traces, the ball bonds may each utilize a unique takeoff angle from the bonding pads on the slider 624 that allow the traces to extend to the PCB 634 without contacting one another. The flexible and unique takeoff angles allow the traces to extend between bonding pads with virtually any physical arrangement on the slider 624 and the PCB 634.

Figure 7:
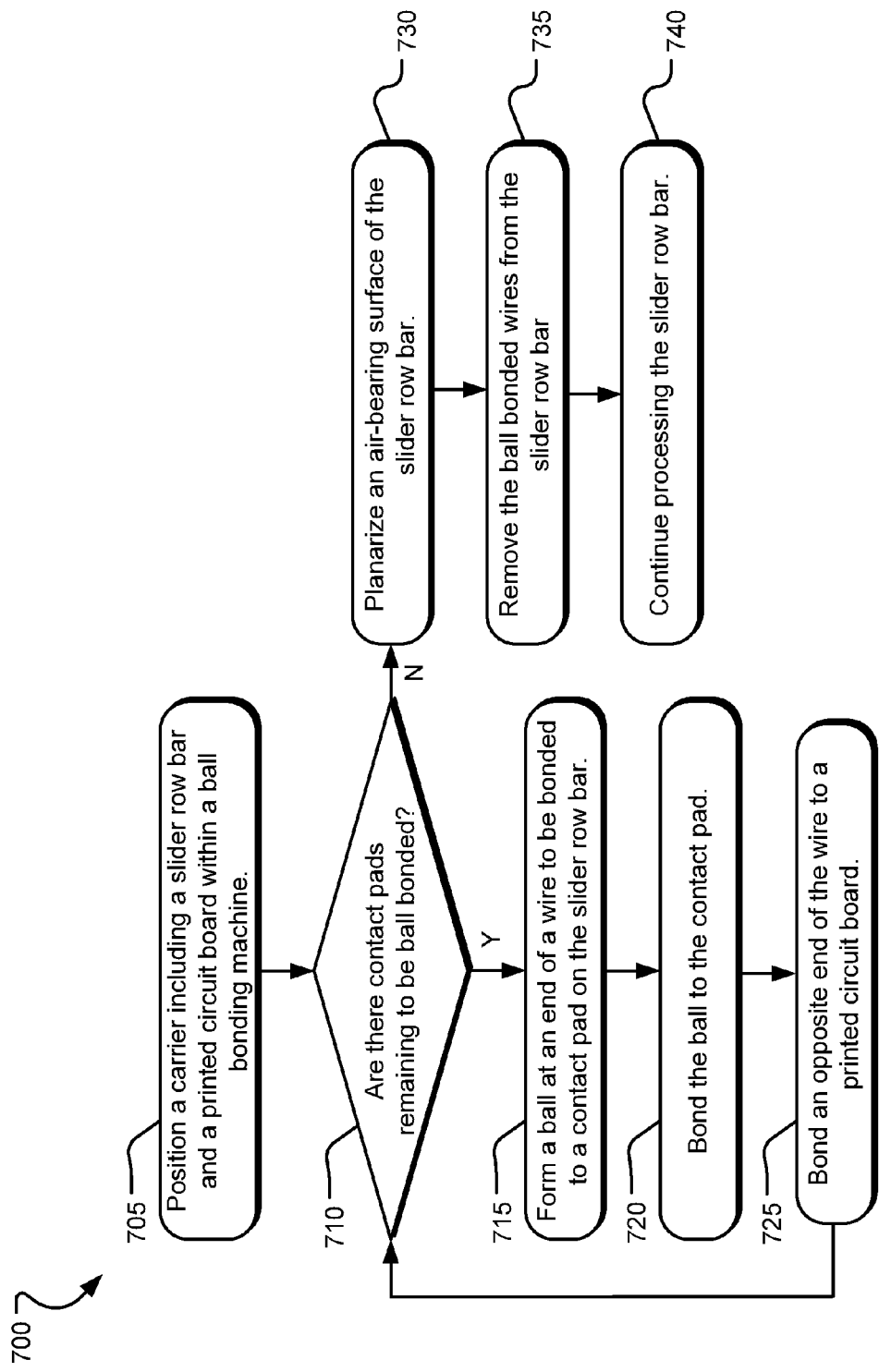
FIG. 7 illustrates example operations for using ball bonding to form wire interconnections between contact pads on a slider row bar and contact pads on a PCB without heating the contact pads on the slider row bar.

FIG. 7 illustrates example operations 700 for using ball bonding to form wire interconnections between contact pads on a slider row bar and contact pads on a PCB without heating the contact pads on the slider row bar. Ball bonding is a type of wire bonding that may be used to make electrical interconnections as part of microelectronic device fabrication. A positioning operation 705 positions a carrier including a slider row bar and a printed circuit board within a ball bonding machine. The row bar includes a row of sliders, each of which has read and/or write heads and may be included in a storage drive assembly or other electronic device. The row bar may include contact pads (e.g., electronic lapping guide (ELG) pads) for providing electrical connections to the row bar (e.g., to planarization sensors within the row bar). The row bar is releasably bonded to a carrier using an adhesive for support and transport.

A decision operation 710 determines if there are unwired contact pads remaining to be ball bonded. If so, a forming operation 715 forms a ball at an end of a wire to be bonded to a contact pad on the slider row bar. The forming operation 715 may occur using an electric flame off (EFO) technique. For example, a wire is fed through a needle-like disposable tool called a capillary of a bonding machine. A high-voltage electric arc applied near the wire tip, which melts the wire at the tip of the capillary. The tip of the wire forms into a ball because of the surface tension of the molten metal. After the electric arc is applied, the molten ball at the end of the wire quickly solidifies.

A bonding operation 720 bonds the ball to the contact pad. In one implementation, the capillary is lowered to contact a surface of the bonding pad. The bonding machine applies ultrasonic energy and downward force that creates a bond between the ball and the bonding pad. In some implementations, the bonding pad may be plasma cleaned prior to the bonding operation 720. In other implementations, the bonding pad is not plasma cleaned. Bonding operation 725 bonds an opposite end of the wire to a printed circuit board (e.g., using a stitch bond or other available bonding techniques).

Operations 710, 715, 720, 725 are repeated until there no remaining unwired contact pads to be ball bonded. In another implementation, the bonding operation 725 is performed after the operations 710, 715, 720 are complete.

A planarization operation 730 planarizes an air-bearing surface of the slider row bar. In one implementation, the printed circuit board is used to connect the planarization sensors in the row bar and the lapping control unit, which detects a resistance change of the planarization sensors due to surface lapping. The lapping control unit uses this information to control built-in actuators in the lapping carrier to exert a desired quantity of pressure from the back of the slider row bar. For example, one or more planarization sensors may be embedded within the row bar and are electrically connected to at least two of the bonding pads. A resistance value of the planarization sensors varies with the quantity of planarization applied to the row bar. In one implementation, a fixed current or voltage (i.e., an excitation signal) is applied to a pair of contact pads and a corresponding the change in voltage or current (i.e., an electric response) indicates the resistance change which corresponds to a given amount of material removal or the quantity of planarization applied to the slider row bar. This data may be fed back into the planarization operation 730 in order to achieve a desired planarization quantity. In this manner, the slider row bar may be precisely planarized.

Once the slider row bar is adequately planarized, removing operation 735 breaks and removes the ball bonded wires running between the slider row bar and the PCB. In one implementation, the removing operation 735 is accomplished by applying a pulse air jet to blow away the interconnecting wires between the contacts pads on the slider row bar and the printed circuit board. In other implementations, the wires are mechanically sheared off from the slider row bar. Ball bond remnants may remain on some or all of the contact pads after the ball bonded wires are removed. A continuing operation 740 continues processing of the slider row bar for patterning of ABS and dicing the fully patterned row bar into individual sliders or other microelectronic components. In one implementation, additional processes steps are preformed to give the slider row bar desired characteristics and then the slider row bar is separated into individual sliders for use in an electronic storage device or other electronic device. In one implementation, dicing lanes are provided between neighboring sliders on the row bar that are used for dicing the row bar into the individual sliders. Further, the row bar is removed from the lapping carrier and placed onto a dicing carrier before being diced into the individual sliders.

The logical operations making up the embodiments of the invention described herein are referred to variously as operations, steps, objects, or modules. Furthermore, it should be understood that logical operations may be performed in any order, adding and/or omitting operations as desired, unless explicitly claimed otherwise or a specific order is inherently necessitated by the claim language.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A method comprising:
    ball bonding a less than about 1 thousandth of an inch in diameter gold wire to a gold alloy contact pad at about ambient temperature and using a ultrasonic bonding frequency greater than 60 kHz and less than 200 kHz.

2. The method of claim 1, wherein the gold alloy contact pad is less than about 1 micron thick.

3. The method of claim 1, wherein the gold alloy contact pad is not plasma cleaned prior to the ball bonding operation.

4. The method of claim 1, wherein the gold alloy wire is less than about 0.8 thousandths of an inch in diameter.

5. The method of claim 1, wherein the ultrasonic bonding frequency is about 120 kHz.

6. The method of claim 1, wherein the ambient temperature is between 15 degrees Celsius and 25 degrees Celsius.

7. The method of claim 1, further comprising:
    forming a gold ball at an end of the gold alloy wire, wherein the ball bonding operation bonds the gold ball to the gold alloy contact pad.

8. A system comprising:
    an electronic storage device slider having a less than 1 micron thick gold alloy contact pad with a less than 35 micron diameter gold alloy ball bond bonded to the gold alloy contact pad at about ambient temperature and using a ultrasonic bonding frequency greater than 60 kHz and less than 200 kHz.

9. The system of claim 8, wherein the gold alloy wire is less than about 1 thousandth of an inch in diameter.

10. The system of claim 8, wherein the ultrasonic bonding frequency is about 120 kHz.

11. The system of claim 8, wherein the ambient temperature is between 15 degrees Celsius and 25 degrees Celsius.

12. The system of claim 8, wherein the electronic storage device slider includes a protruding microelectronic component adjacent to the gold alloy contact pad.

13. A system comprising:
    a printed circuit board with a less than about 1 thousandth of an inch diameter gold wire extending therefrom; and
    a bar of microelectronic devices, each with one or more less than 1 micron thick gold alloy contact pads, wherein the gold wires are ball bonded to the microelectronic devices at about ambient temperature and using a ultrasonic bonding frequency greater than 60 kHz and less than 200 kHz.

14. The system of claim 13, wherein the ultrasonic bonding frequency is about 120 kHz.

15. The system of claim 13, wherein a planar bonding surface of the printed circuit board is oriented at about 5 degrees with respect to a planar bonding surface of the gold alloy contact pads.

16. The system of claim 13, further comprising:
    a planarization sensor with a resistance value that varies with a quantity of planarization performed on the bar of microelectronic devices.

17. The system of claim 16, wherein the printed circuit board is configured to monitor the resistance value of the planarization sensor to measure the quantity of planarization performed on the bar of microelectronic devices.

18. The system of claim 13, wherein each of two or more of the gold wires ball bonded to the microelectronic devices extend from the microelectronic devices at disparate angles.

19. The system of claim 13, wherein each of the microelectronic devices includes a protruding laser adjacent to one or more of the gold alloy contact pads.

20. The system of claim 13, wherein the microelectronic devices are electronic storage device sliders.

* * * * *